US012751156B2

(12) United States Patent
Wang et al.

(10) Patent No.: US 12,751,156 B2
(45) Date of Patent: Sep. 29, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yu Wang, Beijing (CN); Fan He, Beijing (CN); Kemeng Tong, Beijing (CN); Cong Fan, Beijing (CN); Peng Xu, Beijing (CN); Guoyi Cui, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 480 days.

(21) Appl. No.: 18/032,510

(22) PCT Filed: Dec. 21, 2020

(86) PCT No.: PCT/CN2020/138005
§ 371 (c)(1),
(2) Date: Apr. 18, 2023

(87) PCT Pub. No.: WO2022/133647
PCT Pub. Date: Jun. 30, 2022

(65) Prior Publication Data

US 2023/0397460 A1 Dec. 7, 2023

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *G06F 3/04164* (2019.05);
(Continued)

(58) Field of Classification Search
CPC ...... G06F 3/0443; G06F 3/044; G06F 3/0413; G06F 3/0418; G02F 1/13
See application file for complete search history.

(56) References Cited

U.S. PATENT DOCUMENTS

2019/0018050 A1 1/2019 Wang et al.
2020/0167037 A1* 5/2020 Lee ...................... H10K 59/873
(Continued)

FOREIGN PATENT DOCUMENTS

CN 203786433 U 8/2014
CN 105044940 A 11/2015
(Continued)

OTHER PUBLICATIONS

CN202080003478.3 first office action.
(Continued)

*Primary Examiner* — Marc-Anthony Armand
(74) *Attorney, Agent, or Firm* — IPro, PLLC

(57) ABSTRACT

Provided are a display panel and display apparatus, including: a plurality of touch-control electrodes and a plurality of touch-control electrode leads, at least one touch-control electrode being connected to at least one touch-control electrode lead; a display panel including a display region and a non-display region surrounding the display region, the plurality of touch-control electrodes being located in the display region; the display panel also includes lead labels arranged around at least one of the touch-control electrode leads and used for identifying the leads of the touch-control electrodes.

16 Claims, 8 Drawing Sheets

(51) Int. Cl.
*G06F 3/044* (2006.01)
*H10K 59/40* (2023.01)

(52) U.S. Cl.
CPC .......... *G06F 3/0418* (2013.01); *G06F 3/0445* (2019.05); *G06F 3/0446* (2019.05); *H10K 59/40* (2023.02)

(56) References Cited

U.S. PATENT DOCUMENTS

| | | | | |
|---|---|---|---|---|
| 2020/0310575 | A1 | 10/2020 | He et al. | |
| 2021/0026513 | A1* | 1/2021 | Lee | G06F 3/0445 |

FOREIGN PATENT DOCUMENTS

| | | | | |
|---|---|---|---|---|
| CN | 106370967 | A | | 2/2017 |
| CN | 109871151 | A | * | 6/2019 |
| CN | 110018753 | A | | 7/2019 |
| CN | 110399960 | A | | 11/2019 |
| CN | 210324155 | U | | 4/2020 |
| KR | 20130113178 | A | | 10/2013 |

OTHER PUBLICATIONS

CN202080003478.3 second office action.
CN202080003478.3 third office action.
PCT/CN2020/138005 international search report.

* cited by examiner

DISPLAY PANEL AND DISPLAY APPARATUS

CROSS REFERENCE TO RELATED APPLICATIONS

The present disclosure is a US National Stage of International Application No. PCT/CN2020/138005, filed on Dec. 21, 2020, the entire contents of which are incorporated herein by reference.

FIELD

The present disclosure relates to the technical field of display, and particularly to a display panel and a display apparatus.

BACKGROUND

As the display technology rapidly progresses, a requirement of users on touch performance keeps increasing. Currently, a touch function is tested by arranging a large number of touch electrodes in a display product, leading out the touch electrodes by means of leads, and detecting a change in capacitance generated when a finger touches the display product.

Owing to a vast number of touch electrodes and wires connected to the touch electrodes, distinguishing touch channels corresponding to the wires is far from easy. In order to test the touch function, it takes a long time to distinguish and calibrate them. If the touch function is abnormal, it is impossible to accurately locate a defect and a touch channel to be analyzed.

SUMMARY

An embodiment of the present disclosure provides a display panel. The display panel includes: a plurality of touch electrodes; and a plurality of touch electrode leads, at least one touch electrode being connected to at least one touch electrode lead; where the display panel includes a display region and a non-display region surrounding the display region, the plurality of touch electrodes being arranged in the display region; and the display panel further includes a lead label arranged around at least one touch electrode lead and used for identifying the touch electrode lead.

In some embodiments of the present disclosure, the lead label is arranged adjacent to a location at which the at least one touch electrode lead is connected to the corresponding touch electrode.

In some embodiments of the present disclosure, the display panel further includes: detection pins arranged in the non-display region on a side of the display region, the touch electrode leads extending along edges of the display region and connected to the corresponding detection pins; and pin labels arranged around the detection pins and used for identifying the corresponding detection pins.

In some embodiments of the present disclosure, the pin label is arranged at a location adjacent to a side of the detection pin facing away from the touch electrode lead connected to the detection pin.

In some embodiments of the present disclosure, identification content of the corresponding lead label connected to the touch electrode lead is the same as identification content of the pin label corresponding to the detection pin connected to the touch electrode lead.

In some embodiments of the present disclosure, the identification content of the lead label is letters, numbers or combinations of letters and numbers; and the identification content of the pin label is letters, numbers or combinations of letters and numbers.

In some embodiments of the present disclosure, the display panel further includes: a base substrate; a driving circuit layer arranged on the base substrate and including a plurality of metal layers; an organic light-emitting diode device layer arranged on a side of the driving circuit layer facing away from the base substrate; an encapsulation layer arranged on a side of the organic light-emitting diode device layer facing away from the base substrate; and a touch functional layer arranged on a side of the encapsulation layer facing away from the organic light-emitting diode device layer and including at least one metal layer; where the touch electrodes are arranged in the metal layer of the touch functional layer; the touch electrode leads are arranged on the same layer as at least one metal layer of the touch functional layer; the lead labels are arranged on the same layer as at least one metal layer of the touch functional layer; the detection pins are arranged on the same layer as at least one metal layer of the driving circuit layer and/or at least one metal layer of the touch functional layer; and the pin labels are arranged on the same layer as at least one metal layer of the driving circuit layer and/or at least one metal layer of the touch functional layer.

In some embodiments of the present disclosure, the touch functional layer includes: a touch barrier layer arranged on a surface of a side of the encapsulation layer facing away from the organic light-emitting diode device layer; a first metal layer arranged on a surface of a side of the touch barrier layer facing away from the encapsulation layer; an insulating layer arranged on a surface of a side of the first metal layer facing away from the touch barrier layer; a second metal layer arranged on a surface of a side of the insulating layer facing away from the first metal layer; and a protective layer arranged on a surface of a side of the second metal layer facing away from the insulating layer; and the touch electrode lead includes: a first lead layer arranged on the same layer as the first metal layer; a second lead layer arranged on the same layer as the second metal layer; the first lead layer is electrically connected to the second lead layer through a via hole of the insulating layer; and the lead labels are arranged on the same layer as the first metal layer or the second metal layer.

In some embodiments of the present disclosure, the driving circuit layer includes: a buffer layer arranged on the base substrate; an active layer arranged on a side of the buffer layer facing away from the base substrate; a gate insulating layer arranged on a side of the active layer facing away from the buffer layer; a gate metal layer arranged on a side of the gate insulating layer facing away from the active layer; an interlayer insulating layer arranged on a side of the gate metal layer facing away from the gate insulating layer; a source and drain metal layer arranged on a side of the interlayer insulating layer facing away from the gate metal layer; and a planarization layer arranged on a side of the source and drain metal layer facing away from the interlayer insulating layer; where the detection pins are arranged on the same layer as the source and drain metal layer and/or the detection pins are arranged on the same layer as the second metal layer, and the pin labels are arranged on the same layer as the source and drain metal layer and/or the pin labels are arranged on the same layer as the second metal layer.

In some embodiments of the present disclosure, the driving circuit layer includes: a buffer layer arranged on the base substrate; an active layer arranged on a side of the buffer layer facing away from the base substrate; a gate insulating layer arranged on a side of the active layer facing away from the buffer layer; a gate metal layer arranged on a side of the gate insulating layer facing away from the active layer; an interlayer insulating layer arranged on a side of the gate metal layer facing away from the gate insulating layer; a first source and drain metal layer arranged on a side of the interlayer insulating layer facing away from the gate metal layer; a first planarization layer arranged on a side of the first source and drain metal layer facing away from the interlayer insulating layer; a second source and drain metal layer arranged on a side of the first planarization layer facing away from the first source and drain metal layer; and a second planarization layer arranged on a side of the second source and drain metal layer facing away from the first planarization layer; where the detection pins are arranged on the same layer as the second source and drain metal layer and/or the detection pins are arranged on the same layer as the second metal layer, and the pin labels are arranged on the same layer as the second source and drain metal layer and/or the pin labels are arranged on the same layer as the second metal layer.

In some embodiments of the present disclosure, the plurality of touch electrodes include a plurality of first touch electrodes and a plurality of second touch electrodes; the first touch electrodes extend in a first direction and are arranged in a second direction; the second touch electrodes extend in the second direction and are arranged in the first direction; the first direction and the second direction intersect; the first touch electrodes are insulated from the second touch electrodes; the plurality of touch electrode leads include a plurality of first touch electrode leads and a plurality of second touch electrode leads; the detection pins include a plurality of first detection pins and a plurality of second detection pins; one ends of the first touch electrode leads are connected to the corresponding first touch electrodes, and the other ends of the first touch electrode leads are connected to the corresponding first detection pins; and one ends of the second touch electrode leads are connected to the corresponding second touch electrodes, and the other ends of the second touch electrode leads are connected to the corresponding second detection pins.

In some embodiments of the present disclosure, the first touch electrodes are arranged in the first metal layer, and the second touch electrodes are arranged in the second metal layer; or the first touch electrodes include first sub-electrodes and second sub-electrodes, the first sub-electrodes are arranged in the first metal layer, the second sub-electrodes are arranged in the second metal layer, and the first sub-electrodes are electrically connected to the corresponding second sub-electrodes through the via hole of the insulating layer; and the second touch electrodes are arranged in the second metal layer.

In some embodiments of the present disclosure, the detection pins are arranged in the non-display region on a side of the display region in the second direction, the non-display region at which the detection pins are arranged is a first region, the non-display region on a side opposite the detection pins is a second region, and the non-display regions on two sides of the detection pins are a third region and a fourth region; one first touch electrode is correspondingly connected to one first touch electrode lead, and one second touch electrode is correspondingly connected to one second touch electrode lead; the first touch electrode lead is connected to one end of the corresponding first touch electrode in the third region or the fourth region, the first touch electrode lead extends to the first region along the third region or the fourth region by taking a location at which the corresponding first touch electrode is connected as a starting point, and is connected to the corresponding first detection pin; and the second touch electrode lead is connected to one end of the corresponding second touch electrode in the first region, and the second touch electrode lead extends along the first region by taking a location at which the corresponding second touch electrode is connected as a starting point, and is connected to the corresponding second detection pin; or one first touch electrode is correspondingly connected to one first touch electrode lead, and one second touch electrode is correspondingly connected to two second touch electrode leads; the first touch electrode lead is connected to one end of the corresponding first touch electrode in the third region, the first touch electrode lead extends to the first region along the third region by taking a location at which the corresponding first touch electrode is connected as a starting point, and is connected to the corresponding first detection pin; and part of the second touch electrode lead is connected to one end of the corresponding second touch electrode in the first region, the second touch electrode lead extends along the first region by taking a location at which the corresponding second touch electrode is connected as a starting point, and is connected to the corresponding second detection pin, the remaining part of the second touch electrode lead is connected to one end of the corresponding second touch electrode in the second region, and the second touch electrode lead extends to the first region along the fourth region by taking the location at which the corresponding second touch electrode is connected as a starting point, and is connected to the corresponding second detection pin.

In some embodiments of the present disclosure, the lead label corresponding to the first touch electrode lead is arranged at a location adjacent to a starting point of the first touch electrode lead; and the lead label corresponding to the second touch electrode lead is arranged at a location adjacent to a starting point of the second touch electrode lead.

In some embodiments of the present disclosure, the touch functional layer includes: a touch barrier layer arranged on a surface of a side of the encapsulation layer facing away from the organic light-emitting diode device layer; a metal layer arranged on a surface of a side of the touch barrier layer facing away from the encapsulation layer; and a protective layer arranged on a surface of a side of the metal layer facing away from the touch barrier layer; where the plurality of touch electrodes are arranged in the metal layer; the plurality of touch electrode leads are arranged on the same layer as the metal layer; and the lead labels are arranged on the same layer as the metal layer.

In some embodiments of the present disclosure, the touch electrodes include a plurality of self-capacitance electrodes arranged in an array; one end of the touch electrode lead is connected to the corresponding self-capacitance electrode, and the other end of the touch electrode lead is connected to the corresponding detection pin; and the touch electrode lead extends to the non-display region by taking a location at which the corresponding self-capacitance electrode is connected as a starting point, and is connected to the corresponding detection pin.

In some embodiments of the present disclosure, the lead label corresponding to the touch electrode lead is arranged at a location adjacent to a starting point of the touch electrode lead.

An embodiment of the present disclosure further provides a display panel. The display panel includes: a plurality of touch electrodes; a plurality of touch electrode leads, at least one touch electrode being connected to at least one touch electrode lead; and a plurality of detection pins, one touch electrode lead being connected to one detection pin; where the display panel includes a display region and a non-display region surrounding the display region, and the plurality of touch electrodes are arranged in the display region; the touch electrode leads extend along edges of the display region and are connected to the corresponding detection pins; and the display panel further includes a pin label arranged around at least one detection pin and used for identifying the detection pin.

In some embodiments of the present disclosure, the pin label is arranged at a location adjacent to a side of the detection pin facing away from the touch electrode lead connected to the detection pin.

In some embodiments of the present disclosure, the display panel further includes: a base substrate; a driving circuit layer arranged on the base substrate and including a plurality of metal layers; an organic light-emitting diode device layer arranged on a side of the driving circuit layer facing away from the base substrate; an encapsulation layer arranged on a side of the organic light-emitting diode device layer facing away from the base substrate; and a touch functional layer arranged on a side of the encapsulation layer facing away from the organic light-emitting diode device layer and including at least one metal layer; where the touch electrodes are arranged in the metal layer of the touch functional layer; the touch electrode leads are arranged on the same layer as at least one metal layer of the touch functional layer; the detection pins are arranged on the same layer as at least one metal layer of the driving circuit layer and/or at least one metal layer of the touch functional layer; and the pin labels are arranged on the same layer as at least one metal layer of the driving circuit layer and/or at least one metal layer of the touch functional layer.

In some embodiments of the present disclosure, the driving circuit layer includes: a buffer layer arranged on the base substrate; an active layer arranged on a side of the buffer layer facing away from the base substrate; a gate insulating layer arranged on a side of the active layer facing away from the buffer layer; a gate metal layer arranged on a side of the gate insulating layer facing away from the active layer; an interlayer insulating layer arranged on a side of the gate metal layer facing away from the gate insulating layer; a source and drain metal layer arranged on a side of the interlayer insulating layer facing away from the gate metal layer; and a planarization layer arranged on a side of the source and drain metal layer facing away from the interlayer insulating layer; where the detection pins are arranged on the same layer as the source and drain metal layer and/or the detection pins are arranged on the same layer as the second metal layer, and the pin labels are arranged on the same layer as the source and drain metal layer and/or the pin labels are arranged on the same layer as the second metal layer.

In some embodiments of the present disclosure, the driving circuit layer includes: a buffer layer arranged on the base substrate; an active layer arranged on a side of the buffer layer facing away from the base substrate; a gate insulating layer arranged on a side of the active layer facing away from the buffer layer; a gate metal layer arranged on a side of the gate insulating layer facing away from the active layer; an interlayer insulating layer arranged on a side of the gate metal layer facing away from the gate insulating layer; a first source and drain metal layer arranged on a side of the interlayer insulating layer facing away from the gate metal layer; a first planarization layer arranged on a side of the first source and drain metal layer facing away from the interlayer insulating layer; a second source and drain metal layer arranged on a side of the first planarization layer facing away from the first source and drain metal layer; and a second planarization layer arranged on a side of the second source and drain metal layer facing away from the first planarization layer; where the detection pins are arranged on the same layer as the second source and drain metal layer and/or the detection pins are arranged on the same layer as the second metal layer, and the pin labels are arranged on the same layer as the second source and drain metal layer and/or the pin labels are arranged on the same layer as the second metal layer.

An embodiment of the present disclosure provides a display apparatus. The display apparatus includes any one of the above display panels.

BRIEF DESCRIPTION OF THE DRAWINGS

In order to describe technical solutions in embodiments of the present disclosure more clearly, accompanying drawings required for describing embodiments of the present disclosure will be briefly introduced below. Obviously, accompanying drawings introduced below show merely some embodiments of the present disclosure, and a person of ordinary skill in the art would also be able to derive other accompanying drawings from these accompanying drawings without creative efforts.

DETAILED DESCRIPTION OF THE EMBODIMENTS

Figure 1:
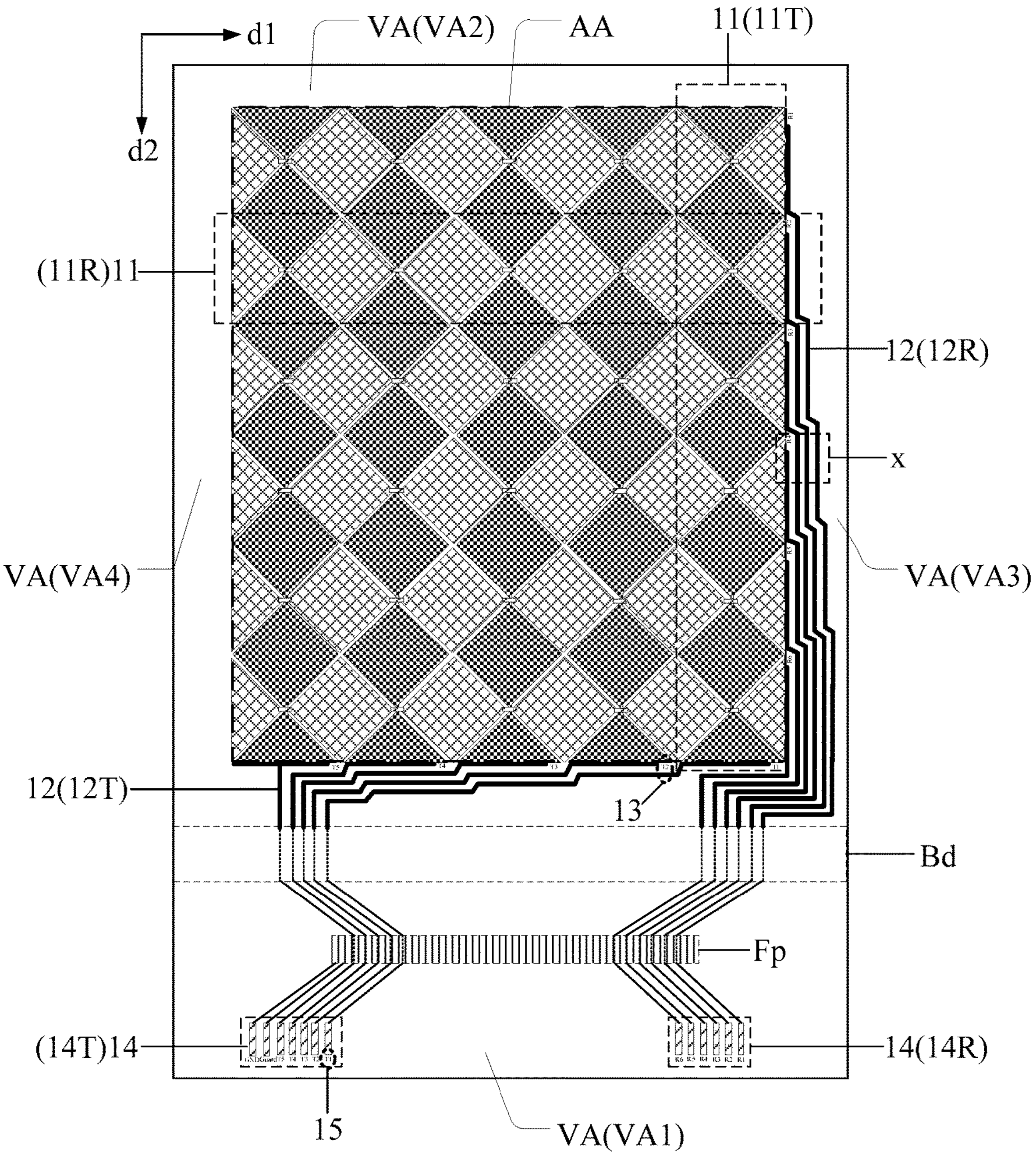
FIG. 1 is a first planar schematic structural diagram of a display panel according to embodiments of the present disclosure.

In order to make the above objectives, features and advantages of the present disclosure clearer and more comprehensible, the present disclosure will be further described below in combination with accompanying drawings and embodiments. However, exemplary implementation modes can be implemented in many forms and should not be construed as being limited to implementation modes set forth herein. On the contrary, these implementation modes are provided to make the present disclosure more thorough and complete, and to fully convey the concept of exemplary implementation modes to a person skilled in the art. In figures, the same reference numerals denote the same or similar structures, and thus their repeated description will be omitted. Words expressing locations and directions described in the present disclosure are all described by taking accompanying drawings as examples, but changes can be made according to requirements, and the made changes all fall within the scope of protection of the present disclosure. Accompanying drawings of the present disclosure are only used for illustrating relative location relations but do not represent the true scale.

With the development of a display technology, an organic light-emitted diode (OLED) display technology has shown enormous potential. The excellent display performance of an OLED brings a wide application space, and moreover puts forward higher requirements for integration of a screen.

At present, in the case of a touch sensor panel (TSP), a metal grid touch electrode layer is manufactured on an encapsulation layer of a display panel through a flexible multi-layer on cell (FMLOC) technology, so as to carry out touch without an external TSP. This process can reduce a thickness of the screen, which is conducive to folding; and moreover, there is no fit tolerance, which can reduce a border width.

During an FMLOC design, since there are a large number of signal wires connected to touch electrodes, errors are likely to occur. Even if a software lighting function can be used for distinguishing channels to prevent errors, calibration will spend more time. In addition, during product analysis and TSP defect resolution, it is difficult to distinguish the channels, and it is impossible to accurately locate a location at which a defect occurs and an FMLOC channel to be analyzed.

In view of this, an embodiment of the present disclosure provides a display panel, which may distinguish leads connected to touch electrodes, so as to overcome the above problems.

FIG. 1 is a first planar schematic structural diagram of a display panel according to an embodiment of the present disclosure.

With reference to FIG. 1, a display panel includes: a display region AA and a non-display region VA surrounding the display region AA. The display region AA is used for image display, and the non-display region VA may be used for wiring and binding.

The display region AA includes a plurality of touch electrodes 11. In an embodiment of the present disclosure, the touch electrode 11 is formed by one or more metal meshes. When a finger touches the display region AA, a capacitance value of the touch electrode changes, so as to detect a touch location.

The display panel includes a plurality of touch electrode leads 12, and each touch electrode 11 is connected to at least one touch electrode lead 12. The touch electrodes 11 are connected to a driving chip in the non-display region VA by being connected to the touch electrode leads 12, and the driving chip applies driving signals to the corresponding touch electrodes 11 by means of the touch electrode leads 12, touch signals generated by the touch electrodes 11 may be also transmitted to the driving chip by means of the touch electrode leads 12 such that the driving chip may detect a location at which touch occurs.

In an embodiment of the present disclosure, at least one touch electrode lead 12 is provided with a lead label 13 in a region around the touch electrode lead 12, where the lead label 13 is used for identifying the touch electrode lead 12. Thus, confusion generated when drawings are designed for the touch electrodes and the touch electrode leads is avoided. After the drawings are designed, channels constituted by the touch electrode leads and the connected touch electrodes may be precisely calibrated according to the lead labels, so as to improve efficiency of drawing inspection. Moreover, by adding the lead labels to the touch electrode leads, it is more convenient to analyze touch performance of the panel, and under the condition that touch performance of the panel is poor, a location of the touch channel at which a problem occurs may be quickly and accurately found, and analyzed.

Optionally, the lead label 13 may be arranged at a location adjacent to the touch electrode lead 12 connected to the corresponding touch electrode 11. In this way, the touch electrode lead 12 may be identified more intuitively.

Figure 2:
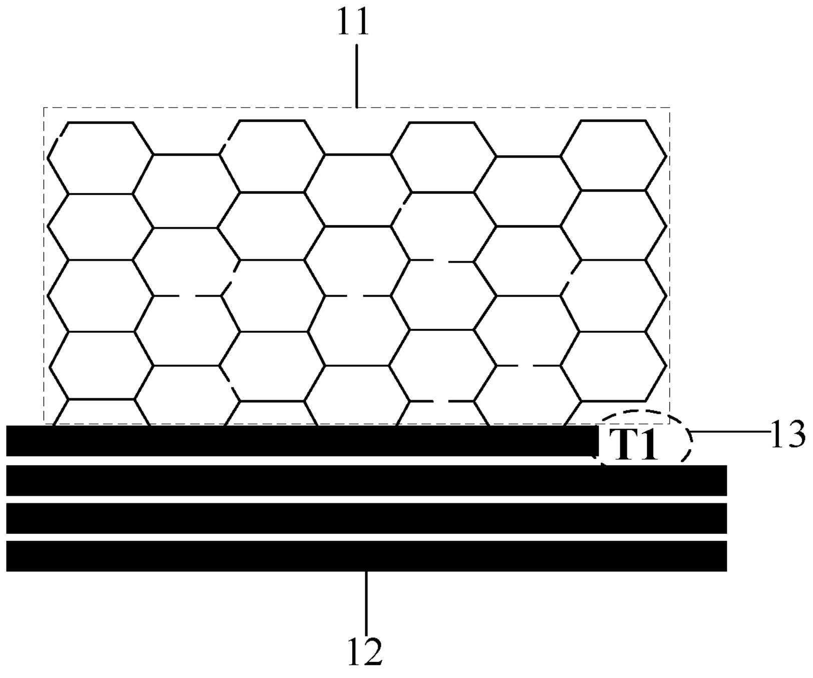
FIG. 2 is a partial enlarged view of a location of a dashed box x in FIG. 1.

FIG. 2 is a partial enlarged view of a location of a dashed box x in FIG. 1.

With reference to FIG. 2, the touch electrode 11 may be made in a grid structure, and the touch electrode lead 12 is arranged on a side of the touch electrode 11 and connected to the touch electrode 11. It can be seen from FIG. 2 that the touch electrode leads 12 connected to different touch electrodes are densely arranged at edges of the display region, and the lead labels 13 are arranged at locations adjacent to the touch electrode leads 12 connected to the touch electrodes 11, so as to identify the touch electrode leads 12, which is conducive to distinguishing between the touch electrode leads 12 and also plays a role in identifying the touch channels.

With reference to FIG. 1, the display panel further includes detection pins 14 and pin labels 15.

The detection pins 14 are arranged in the non-display region VA on a side of the display region AA; and the touch electrode leads 12 extend along edges of the display region AA to the non-display region at which the detection pins 14 are arranged, and are finally connected to the corresponding detection pins 14.

The detection pins 14 are used for providing driving signals for the touch electrodes 11 in a detection stage, so as to detect whether each touch channel is abnormal. After detection is completed, the driving chip is bound again, the touch electrode leads 12 are electrically connected to the driving chip, and the driving chip receives touch signals or sends the driving signals.

In a specific application process, the touch electrode leads 12 may be directly connected to the detection pins 14, or may be finally connected to the detection pins 14 after being subjected to layer switching in the non-display region, which is not limited herein.

With reference to FIG. 1, it can be seen that pin labels 15 for identifying the detection pins 14 are arranged around the detection pins 14.

Paths are formed between the detection pins 14, the touch electrode leads 12 and the touch electrodes 11, and after the pin labels 15 are added to the detection pins 14, it is more convenient to analyze touch performance of the panel, and under the condition that touch performance of the panel is poor, locations of the touch channels having problems may be quickly and accurately found.

Optionally, the pin label 15 may be arranged at a location adjacent to a side of the detection pin 14 facing away from the connected touch electrode lead 12. In this way, the detection pins 14 may be identified more intuitively.

Figure 3:
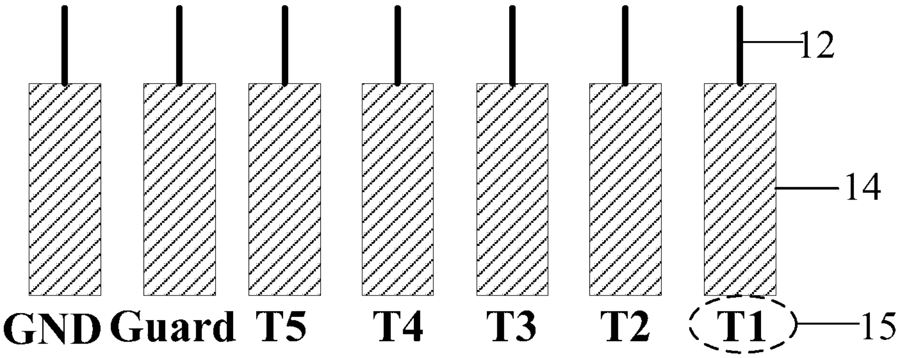
FIG. 3 is a partial enlarged view of a location of a dashed box y in FIG. 1.

FIG. 3 is a partial enlarged view of a location of a dashed box y in FIG. 1.

With reference to FIG. 3, a pin label 15 is arranged at a location adjacent to a side of the detection pin 14 facing away from the connected touch electrode lead 12. In general, the detection pins 14 are small in size and arranged in a row, and therefore may not be easily distinguished from each other. Thus, the pin label 15 is arranged at a location adjacent to each detection pin 14 to identify the detection pin 14 such that the corresponding detection pin 14 may be accurately found when each touch channel is detected.

It should be noted that each touch electrode lead 12 is finally connected to one detection pin 14, and each touch electrode lead 12 is used for transmitting a signal to a touch channel at which one touch electrode 11 is arranged. Therefore, in an embodiment of the present disclosure, comparing FIG. 2 and FIG. 3, identification content of the lead label 13 correspondingly connected to the touch electrode lead 12 is the same as identification content of the pin label 15 corresponding to the detection pin 14 connected to the touch electrode lead 12.

The identification content of the lead labels 13 and the identification content of the pin labels 15 may be used for distinguishing the touch channels. During specific implementation, the identification content of the lead labels 13 may be letters, numbers or combinations of letters and numbers, and the identification content of the pin labels 15 may be letters, numbers or combinations of letters and numbers, which are not limited herein.

When touch detection is carried out, the detection pin 14 transmits a driving signal to the connected touch electrode lead 12, such that the detection pin 14 and the connected touch electrode lead 12 are identified by means of labels having the same identification content, and the corresponding driving signal may be accurately transmitted to the touch channel corresponding to the identification content.

For example, for a mutual capacitance type display panel, the touch electrodes are divided into touch driving electrodes Tx and touch detection electrodes Rx, such that the lead labels 13 of the touch electrode leads 12 connected to the touch driving electrodes Tx may be T1, T2, T3, etc., and the pin labels corresponding to the detection pins connected to these touch electrode leads may also be T1, T2, T3, etc. The lead labels 13 of the touch electrode leads 12 connected to the touch detection electrodes Rx may be R1, R2, R3, etc., and the pin labels of the detection pins connected to the touch electrode leads may be R1, R2, R3, etc., which are not limited herein. For a self-capacitance type display panel, the touch electrodes are self-capacitance electrodes, such that the lead labels 13 corresponding to the touch electrode leads 12 connected to the self-capacitance electrodes and the pin labels 15 corresponding to the detection pins 14 connected to the touch electrode leads 12 may be identified by Q1, Q2, Q3,etc., which are not limited herein.

With reference to FIG. 3, the display panel further includes pins for providing other signals in addition to the above detection pins 14, and these pins may be arranged side by side with the detection pins 14. For example, the display panel further includes ground pins connected to ground signal lines, pins for outputting voltage stabilizing signals, etc.

In an embodiment of the present disclosure, a pin label is also added to the above pin such that a signal output by the pin may be effectively identified and distinguished from each detection pin 14 connected to the touch electrode lead 12. As shown in FIG. 3, the pin label corresponding to the ground pin connected to the ground signal line may be GND, and the pin label corresponding to the pin connected to a voltage stabilizing signal line may be Guard, which is not limited herein.

When the display panel is manufactured, the touch electrode leads 12 and the lead labels 13, and the detection pins 14 and the pin labels 15 may be formed simultaneously with the metal layer of the display panel.

Figure 4:
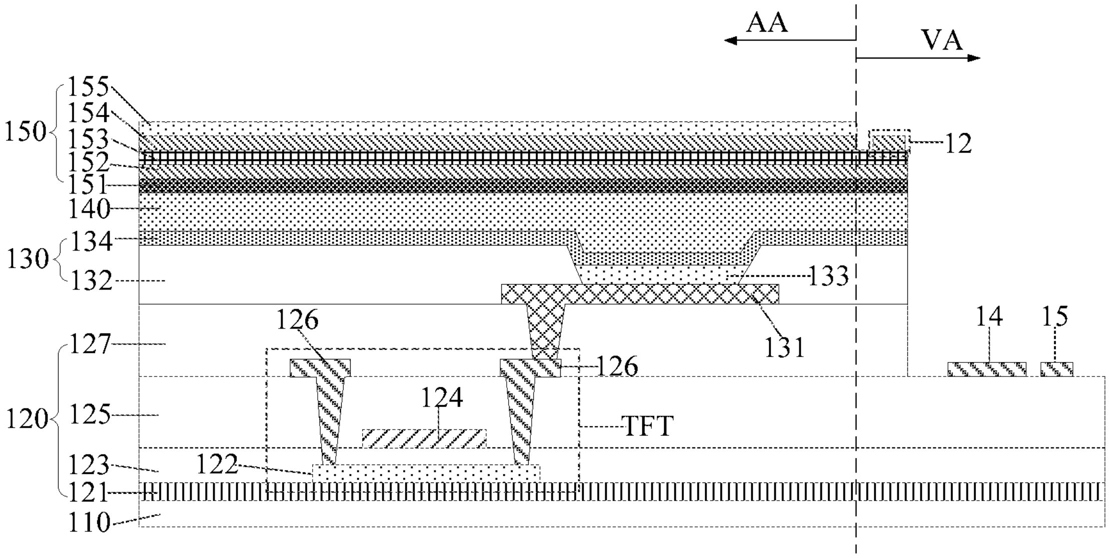
FIG. 4 is a first sectional schematic structural diagram of a display panel according to embodiments of the present disclosure.
Figure 5:
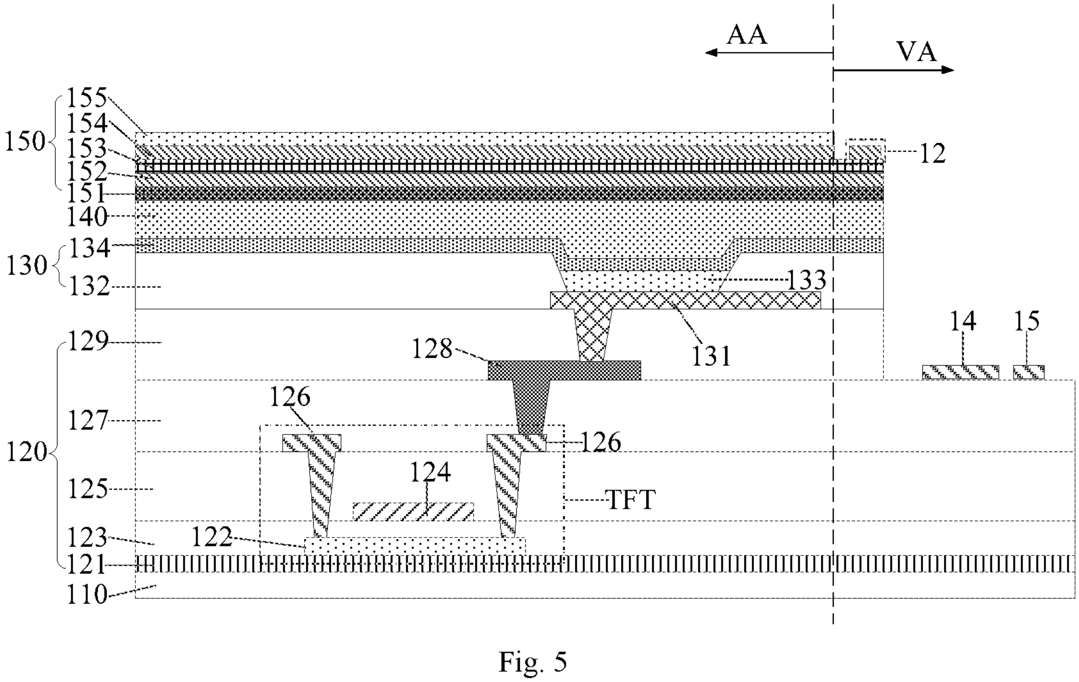
FIG. 5 is a second sectional schematic structural diagram of a display panel according to embodiments of the present disclosure.

Specifically, FIG. 4 is a first sectional schematic structural diagram of a display panel according to an embodiment of the present disclosure; and FIG. 5 is a second sectional schematic structural diagram of a display panel according to an embodiment of the present disclosure.

With reference to FIGS. 4 and 5, the display panel includes:

- a base substrate 110, having supporting and carrying functions;
- a driving circuit layer 120, arranged on the base substrate and used for providing a driving signal for a pixel unit;
- an organic light-emitting diode device layer 130, arranged on a side of the driving circuit layer 120 facing away from the base substrate 110;
- where, the display panel provided in an embodiment of the present disclosure may be an organic light-emitting diode display panel, and in the organic light-emitting diode display panel, a light-emitting device serving as a pixel unit is an organic light-emitting diode device;
- an encapsulation layer 140, arranged on a side of the organic light-emitting diode device layer 130 facing away from the base substrate 120, where the encapsulation layer 140 is of a structure in which inorganic layers and organic layers are alternately stacked, and is used for encapsulating the organic light-emitting diode device and blocking water and oxygen from entering the organic light-emitting diode device; and
- a touch functional layer 150, arranged on a side of the encapsulation layer 140 facing away from the organic light-emitting diode device layer 130.

In an embodiment of the present disclosure, a metal grid electrode is directly manufactured on the encapsulation layer 140 without an external touch device such that an overall thickness of the display panel may be reduced, which is suitable for a flexible display panel. The touch display panel manufactured through the technology does not have the problem of fit tolerance, and a border width may be further reduced.

In an implementable mode, with reference to FIG. 4, the driving circuit layer 120 specifically includes: a buffer layer 121.

The buffer layer 121 is arranged on the base substrate 110. The buffer layer 121 may match stress between the base substrate 110 and an upper film layer, and may further improve sealing performance of the display panel. The buffer layer 121 may be made of an inorganic material, which is not limited herein.

An active layer 122 is arranged on a side of the buffer layer 121 facing away from the base substrate 110. The active layer 122 is a functional film layer for manufacturing a thin film transistor, and the active layer 122 has a predetermined pattern. The active layer 122 includes a source region and a drain region formed by doping N-type ions or P-type ions, and a region between the source region and the drain region is a channel region which is not doped.

A gate insulating layer 123 is arranged on a side of the active layer 122 facing away from the buffer layer 121. The gate insulating layer 123 is used for insulating the metal layer above the active layer 122. The gate insulating layer 123 may be made of silicon oxide, silicon nitride, etc., which is not limited herein.

A gate metal layer 124 is arranged on a side of the gate insulating layer 123 facing away from the active layer 122. The gate metal layer 124 has a pattern including a gate electrode and a gate line. The gate metal layer 124 may be of a stacked structure having a single layer of or multiple layers of metal, which is not limited herein.

An interlayer insulating layer 125 is arranged on a side of the gate metal layer 124 facing away from the gate insulating layer 123. The interlayer insulating layer 125 is used for insulating the metal layer above the gate metal layer 124. The gate insulating layer 125 may be made of silicon oxide, silicon nitride, etc., which is not limited herein.

The source and drain metal layer 126 is arranged on a side of the interlayer insulating layer 125 facing away from the gate metal layer 124. The source and drain metal layer 126 has a pattern including a source, a drain and a data line. The source and drain metal layer 126 may be of a stacked structure having a single layer of or multiple layers of metal, which is not limited herein.

The active layer, the gate, the source and the drain constitute a thin film transistor (TFT) structure.

A planarization layer 127 is arranged on a side of the source and drain metal layer 126 facing away from the interlayer insulating layer 125. The planarization layer 127 is used for insulating the source and drain metal layer 126 and planarizing a surface of a film layer, which is conducive to formation of other devices on the planarization layer 127. The planarization layer 127 may be made of silicon oxide, silicon nitride, etc., which is not limited herein. A surface of the planarization layer 127 is provided a via hole exposing a drain.

In another implementable mode, with reference to FIG. 5, the driving circuit layer 120 specifically includes: a buffer layer 121 arranged on the base substrate 110.

An active layer 122 is arranged on a side of the buffer layer 121 facing away from the base substrate 110.

A gate insulating layer 123 is arranged on a side of the active layer 122 facing away from the buffer layer 121.

A gate metal layer 124 is arranged on a side of the gate insulating layer 123 facing away from the active layer 122.

An interlayer insulating layer 125 is arranged on a side of the gate metal layer 124 facing away from the gate insulating layer 123.

A first source and drain metal layer 126 is arranged on a side of the interlayer insulating layer 125 facing away from the gate metal layer 124, where the first source and drain metal layer 126 has a pattern including a source, a drain, and a power signal line.

A first planarization layer 127 is arranged on a side of the first source and drain metal layer 126 facing away from the interlayer insulating layer 125, where the first planarization layer 127 is used for insulating the first source and drain metal layer 126 and planarizing a surface of a film layer, which is conducive to formation of other devices on the first planarization layer 127; and the first planarization layer 127 may be made of silicon oxide, silicon nitride, etc., which is not limited herein.

A second source and drain metal layer 128 is arranged on a side of the first planarization layer 127 facing away from the first source and drain metal layer, where the second source and drain metal layer includes a pattern of a data line, etc.

A second planarization layer 129 is arranged on a side of the second source and drain layer 128 facing away from the first planarization layer 127. The second planarization layer 129 is used for insulating the second source and drain metal layer 128 and planarizing a surface of a film layer, which is conducive to formation of other devices on the second planarization layer 129. The second planarization layer 129 may be made of silicon oxide, silicon nitride, etc., which is not limited herein.

After a driving circuit layer 120 is formed on the base substrate 110, an organic light-emitting diode device layer 130 is formed on the driving circuit layer 120. The organic light-emitting diode device layer 130 specifically includes:

a first electrode layer 131 arranged on a side of the planarization layer 127 facing away from the source and drain metal layer 126. The first electrode layer 131 includes a plurality of first electrodes separated from each other, and each first electrode is electrically connected to a drain of a thin film transistor below the first electrode through the via hole of the planarization layer 127, so as to transmit a driving signal to the first electrode. The first electrode layer 131 may be made of a transparent electrically-conductive material such as indium tin oxide, which is not limited herein.

A pixel defining layer 132 is arranged on a side of the planarization layer 127 facing away from the source and drain metal layer 126, and is arranged at a location between the first electrodes. The pixel defining layer 132 is used for separating regions at which the first electrodes are arranged, and has a larger thickness than the first electrode layer 131 and other organic functional film layers.

A light-emitting layer 133 is arranged on a side of the first electrode (131) facing away from the planarization layer 127. The light-emitting layers 133 formed over different first electrodes may be made of the same material or different materials. In the display panel provided in an embodiment of the present disclosure, the light-emitting layers 133 may be made of organic light-emitting materials emitting different colors, and the light-emitting layers are only formed on the corresponding first electrodes; and alternatively, the light-emitting layers 133 may be made of organic light-emitting materials emitting white light, the light-emitting layers are arranged in a whole layer, and then a color film base substrate is arranged to emit light in different colors.

The second electrode layer 134 is arranged on a side of the light-emitting layer 133, a side of the pixel defining layer 132, and a side of a supporting portion facing away from the planarization layer 127. The second electrode layer 134 is formed as a whole layer, and the second electrode layer 134 may be made of an electrically conductive material such as metal silver, which is not limited herein.

When voltages are applied to the first electrode layer 131 and the second electrode layer 134, holes and electrons are recombined into excitons in the light-emitting layer to excite the light-emitting material in the light-emitting layer 133 to emit light.

After the above organic light-emitting diode device layer 130 is formed on the driving circuit layer 120 on the base substrate, an encapsulation layer 140 is formed on a surface of the organic light-emitting diode device layer 130, and the encapsulation layer nearest to the organic light-emitting diode device layer 130 is an inorganic layer, such that water and oxygen are blocked from entering the organic light-emitting diode device layer 130; and an organic layer is added between inorganic layers, so as to relieve stress.

After the encapsulation layer 140 is formed, the touch functional layer 150 is manufactured on the encapsulation layer 140. The touch functional layer 150 may specifically include: a touch barrier layer 151 arranged on a surface of a side of the encapsulation layer 140 facing away from the organic light-emitting diode device layer 130. The touch barrier layer 151 plays a role in blocking between the organic light-emitting diode device layer and the touch electrode. The touch barrier layer 151 may be made of an inorganic material, which is not limited herein.

A first metal layer 152 is arranged on a surface of a side of the touch barrier layer 151 facing away from the encapsulation layer 140. An insulating layer 153 is arranged on a surface of a side of the first metal layer 152 facing away from the touch barrier layer 151. A second metal layer 154 is arranged on a surface of a side of the insulating layer 153 facing away from the first metal layer 152. The first metal layer 151 and the second metal layer 154 are metal layers for implementing a touch functional layer, and have grid patterns, and the two metal layers are insulated from each other by means of the insulating layer 153.

A protective layer 155 is arranged on a surface of a side of the second metal layer 154 facing away from the insulating layer 153. The protective layer 155 plays a role in insulating and protecting the touch electrode layer. The protective layer may be made of an organic material, which is not limited herein.

It can be seen from FIGS. 4 and 5, the driving circuit layer 120 includes a plurality of metal layers, and specifically may include the above gate metal layer 124 and the source and drain metal layer 126; or may include a gate metal layer 124, a first source and drain metal layer 126 and a second source and drain metal layer 128. The touch functional layer 150 includes at least one metal layer, and may specifically include a first metal layer 152 and/or a second metal layer 154.

The touch electrode 11 is arranged in the metal layer of the touch functional layer 150; the touch electrode lead 12 is arranged on the same layer as at least one metal layer of the touch functional layer 150; the lead label 13 is arranged on the same layer as at least one metal layer of the touch functional layer 150; the detection pin 14 is arranged on the same layer as at least one metal layer of the driving circuit layer 120 and/or at least one metal layer of the touch functional layer 150; and the pin label 15 is arranged on the same layer as at least one metal layer of the driving circuit layer 120 and/or at least one metal layer of the touch functional layer 150.

Specifically, under the condition that the above display panel is a mutual capacitance type display panel, the touch functional layer 150 includes a first metal layer 152 and a second metal layer 154, and the touch electrode 11 is arranged on the same layer as the first metal layer 152 and the second metal layer 154. Under the condition that the above display panel is a self-capacitance type display panel, the touch functional layer 150 is only required to include one metal layer, that is, the above first metal layer 152 or the second metal layer 154, and the touch electrode is arranged on the same layer as the metal layer.

The touch electrode lead 12 is arranged on the same layer as at least one metal layer of the touch functional layer 150. Optionally, in order to reduce a load of the touch electrode leads 12, under the condition that the touch functional layer 150 includes a first metal layer 152 and a second metal layer 154, patterns of the touch electrode leads 12 may be formed on both the first metal layer 152 and the second metal layer 154, and then two layers of touch electrode leads are electrically connected to each other through the via hole in the insulating layer between the two metal layers.

Specifically, the touch electrode lead 12 includes: a first lead layer and a second lead layer. The first lead layer is arranged on the same layer as the first metal layer 152, and the second lead layer is arranged on the same layer as the second metal layer 154; and the first lead layer is electrically connected to the second lead layer through the via hole of the insulating layer. The touch electrode lead 12 is set in two layers of metal, which may reduce a load of the touch electrode lead 12.

The touch electrode lead 12 is connected to the touch electrode 11, and the lead label 13 is used for identifying the touch electrode lead 12. Therefore, the lead label 13 corresponding to the touch electrode lead 12 may be arranged on the same layer as at least one metal layer of the touch functional layer, and formed through the same patterning process as the touch electrode 11 on the same layer.

Specifically, the lead label 15 may be arranged on the same layer as the first metal layer 152 or the second metal layer 154. The lead label 15 is not electrically connected to the touch electrode lead 12 and the touch electrode 11, and the lead label 15 is only used for identifying the touch electrode lead 12, such that the lead label 15 is only required to be on the same layer as one metal layer of the touch functional layer. For example, the lead label 15 may be arranged on the same layer as the second metal layer 154 closer to a display side.

The detection pin 14 may be arranged on the same layer as at least one metal layer of the driving circuit layer 120 and/or at least one metal layer of the touch functional layer 150. The detection pin 14 may be of a single-layer structure or a multi-layer structure.

Under the condition that the display panel is of a structure shown in FIG. 4 and the detection pin 14 is of a single-layer structure, the detection pin 14 may be arranged on the same layer as the source and drain metal layer 126 in FIG. 4; and alternatively, the detection pin 14 may be arranged on the same layer as the second metal layer 154. Under the condition that the display panel is of a structure shown in FIG. 4 and the detection pin 14 is of a multi-layer structure, the detection pin 14 may be arranged on the same layer as the source and drain metal layer 126 and the second metal layer 154 in FIG. 4.

Under the condition that the display panel is of a structure shown in FIG. 5 and the detection pin 14 is of a single-layer structure, the detection pin 14 may be arranged on the same layer as the second source and drain metal layer 128 in FIG. 5; and alternatively, the detection pin 14 may be arranged on the same layer as the second metal layer 154. Under the condition that the display panel is of a structure shown in FIG. 5 and the detection pin 14 is of a multi-layer structure, the detection pin 14 may be arranged on the same layer as the second source and drain metal layer 128 and the second metal layer 154 in FIG. 5.

The pin label 15 may be arranged on the same layer as at least one metal layer of the driving circuit layer 120 and/or at least one metal layer of the touch functional layer 150.

Optionally, in order to enable the pin label 15 to be arranged on an uppermost metal layer, for example, the pin label 15 may be arranged on the same layer as the second metal layer 154. In addition, the pin label 15 may be arranged on the same layer as the detection pin 14, which is not specifically limited herein.

Since the detection pin 14 is only used in a detection stage of the display panel, and the detection pin 14 is not arranged at a location adjacent to the touch electrode lead 12 in general, the touch electrode lead 12 is not directly connected to the detection pin 14 in general.

Figure 6:
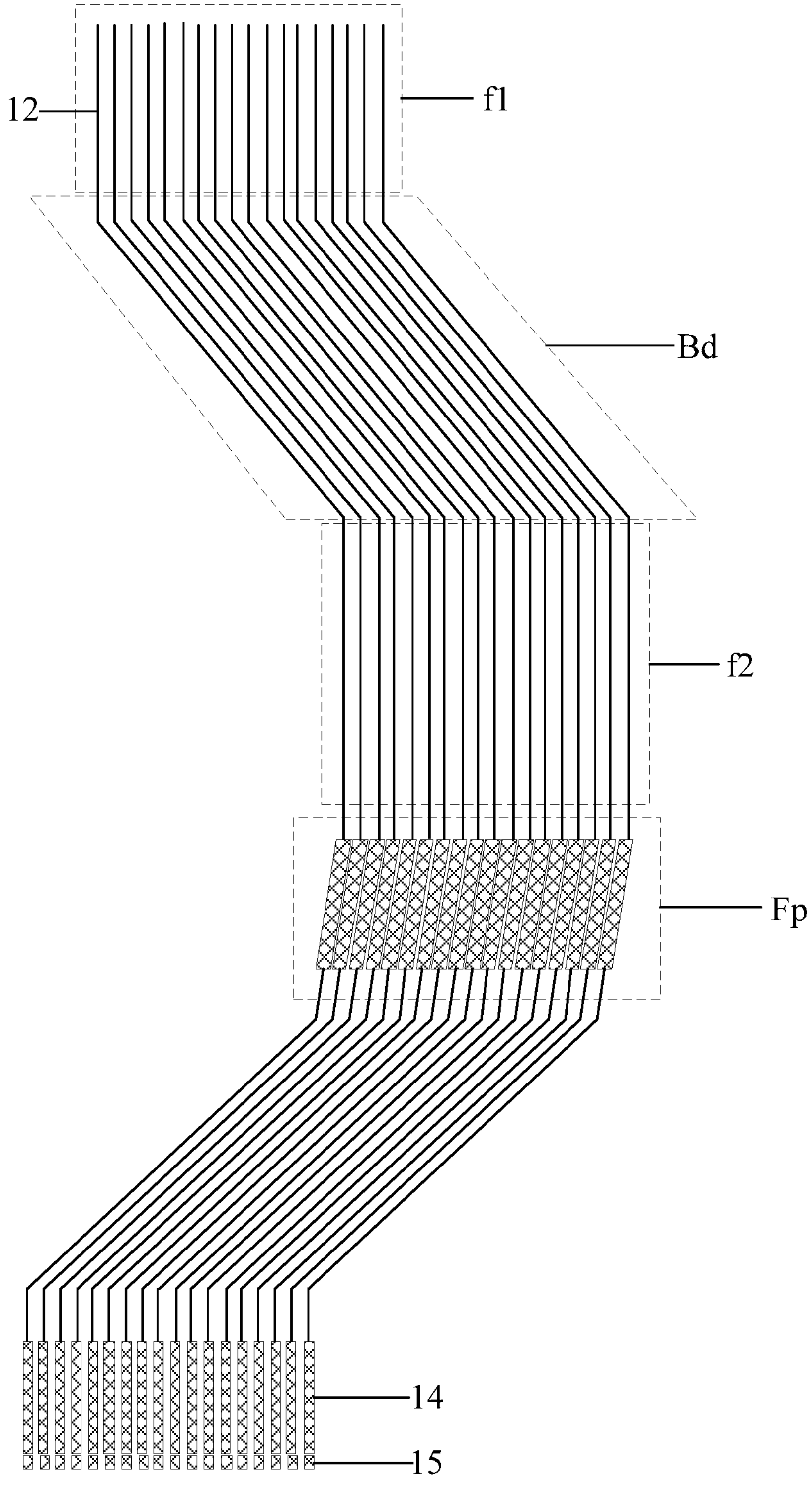
FIG. 6 is a partial enlarged view of a detection pin region in FIG. 1.
Figure 7:
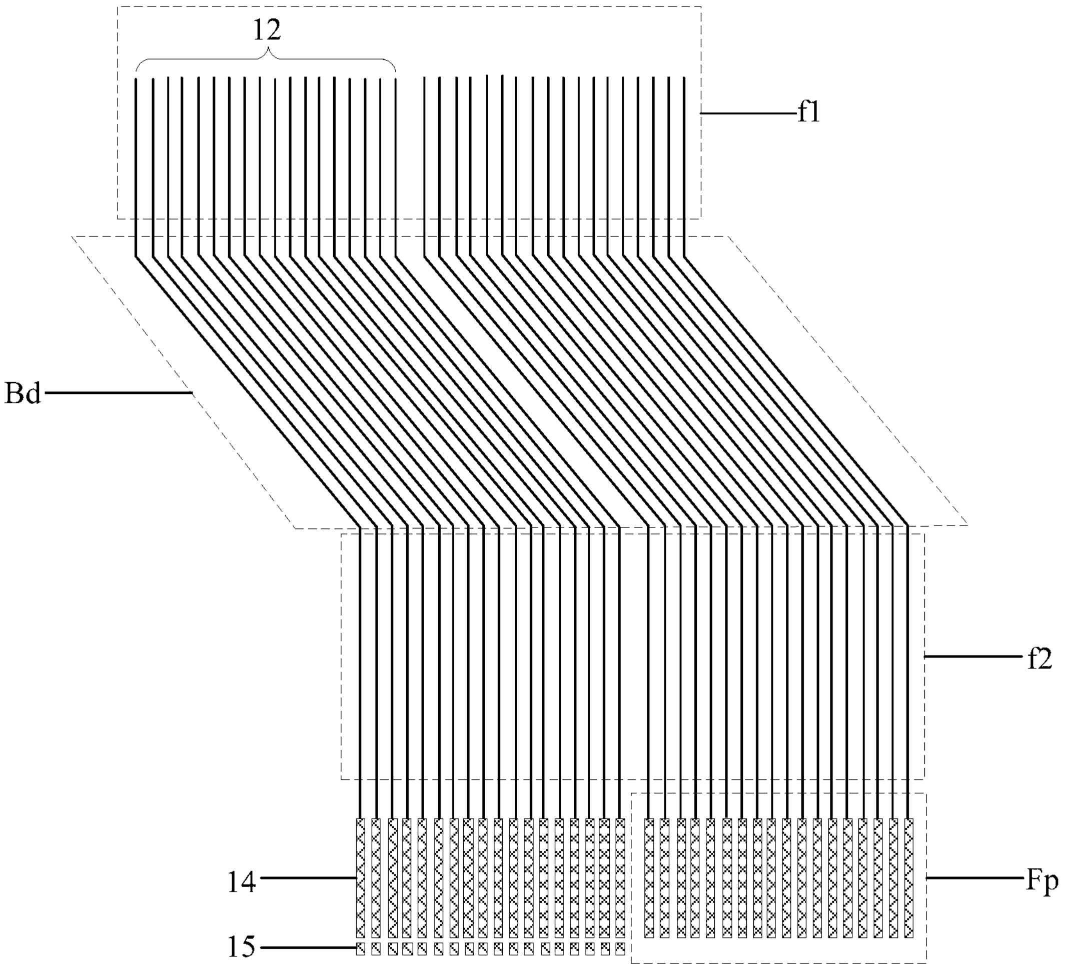
FIG. 7 is another partial enlarged view of a detection pin region according to embodiments of the present disclosure.

FIG. 6 is a partial enlarged view of a detection pin region in FIG. 1; and FIG. 7 is another partial enlarged view of a detection pin region according to an embodiment of the present disclosure.

As shown in FIGS. 6 and 7, the non-display region may be divided into a first routing region f1, a bending region Bd, a second direct routing region f2, a flexible printed circuit (FPC) pin region Fp, and a region at which the detection pin 14 is arranged. After extending to the non-display region along the edge of the display region AA, the touch electrode lead 12 first passes through the first routing region f1 to extend to the bending region Bd. Since the touch electrode lead 12 is made of a metal layer of the touch functional layer 150, the touch electrode lead 12 is likely to be damaged in a process of bending the display panel in the bending region Gd. Therefore, the touch electrode lead 12 is subjected to layer switching in the bending region Bd, and in general, layer switching is carried out to the source and drain metal layer 126 (or the second source and drain metal layer 128) of the driving circuit layer 120, so as to extend to the second routing region f2 and the FPC pin region Fp. In this way, according to film layers at which the FPC pins and the detection pins 14 are arranged, the touch electrode leads may be subjected to layer switching again, such that the touch electrode leads may be subjected to layer switching to the metal layer at which the pins are arranged, and connected to the FPC pins and the detection pins 14.

Under the condition that the detection pin 14 is arranged on the same layer as the source and drain metal layer 126 (or the second source and drain metal layer 128), the touch electrode lead may not be subjected to layer switching after passing through the bending region Bd, and may be directly connected to the detection pin 14 after passing through the second routing region f2 and the FPC pin region Fp.

Under the condition that the detection pin is arranged on the same layer as the second metal layer 154 of the touch functional layer 150, the touch electrode lead may be subjected to layer switching after passing through the bending region Bd to the second metal layer 154, and is connected to the detection pin 14 after passing through the second routing region f2 and the FPC pin region Fp.

With reference to FIG. 6, the detection pin 14 may be arranged on a side of an FPC pin facing away from the bending region Bd, and the detection pin 14 may be cut off after a detection task is completed, so as to avoid affecting the driving signal in a normal image display process.

With reference to FIG. 7, the detection pins 14 may be arranged side by side with the FPC pins, and in this case, the detection pins 14 will be always remained in the display panel.

The above display panel provided in an embodiment of the present disclosure may be a mutual capacitance type display panel or a self-capacitance type display panel.

Figure 8:
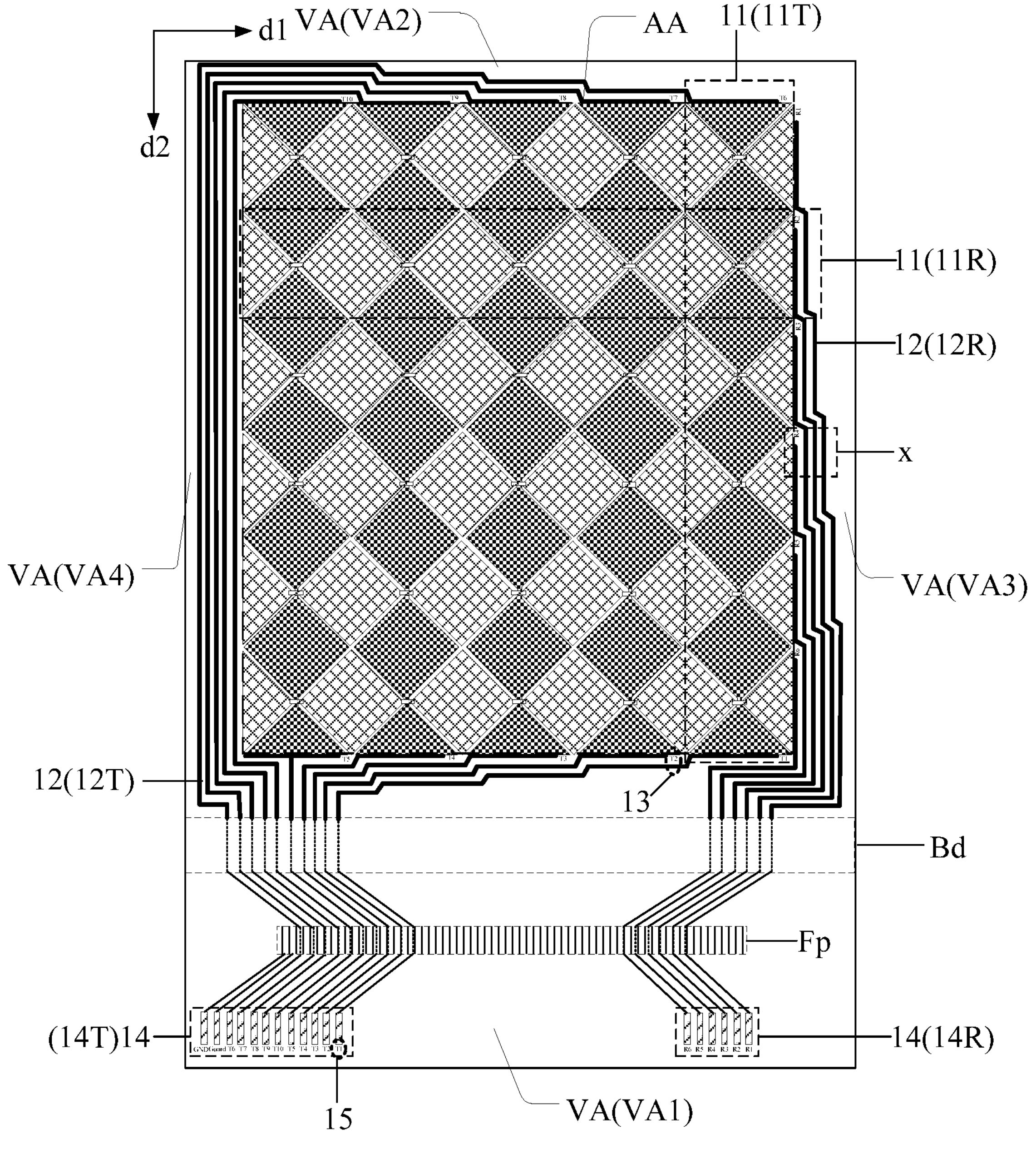
FIG. 8 is a second planar schematic structural diagram of a display panel according to embodiments of the present disclosure.

FIG. 8 is a second planar schematic structural diagram of a display panel according to an embodiment of the present disclosure.

Under the condition that a mutual capacitance type display panel is used, with reference to FIGS. 1 and 8, the touch electrode 11 includes a plurality of first touch electrodes 11R and a plurality of second touch electrodes 11T; the first touch electrodes extend in a first direction d1 and are arranged in a second direction d2; the second touch electrodes 11T extend in the second direction d2 and are arranged in the first direction d1; the first direction d1 and the second direction d2 intersect; and the first touch electrode 11R and the second touch electrode 11T are insulated from each other.

The touch electrode leads 12 include a plurality of first touch electrode leads and a plurality of second touch electrode leads 12T; the detection pins 14 include a plurality of first detection pins 14R and a plurality of second detection pins 14T; one end of the first touch electrode lead is connected to the corresponding first touch electrode 11R, and the other end of the first touch electrode lead 12R is connected to the corresponding first detection pin 14R; and one end of the second touch electrode lead 12T is connected to the corresponding second touch electrode 11T, and the other end of the second touch electrode lead 12T is connected to the corresponding second detection pin 14T.

The first direction d1 may be an extension direction of a pixel unit row, and the second direction d2 may be an extension direction of a pixel unit column, which is not limited herein. The above first touch electrode 11R may be a touch sensing electrode, and the second touch electrode 11T may be a touch driving electrode. In a touch detection process, driving signals are applied to the touch driving electrodes by the second touch electrode leads 12T. When a human hand touches the display screen, a capacitance value between the touch sensing electrode and the touch driving electrode may change, and a location at which touch occurs of the display panel may be determined by detecting a change in an electrical signal of the touch sensing electrode.

Locations of the first touch electrode 11R and the second touch electrode 11T may also be flexibly set. Optionally, the first touch electrode 11R may be arranged on the first metal layer 152, and the second touch electrode 11T may be arranged on the second metal layer 152. Since the insulating layer 153 is arranged between the first metal layer 152 and the second metal layer 154, when the above arrangement method is used, the first touch electrode 11R and the second touch electrode 11T may be insulated from each other without any other process such as bridging.

Optionally, the first touch electrodes 11R may further include first sub-electrodes and second sub-electrodes, the first sub-electrodes are arranged on the first metal layer 152, the second sub-electrodes are arranged on the second metal layer 154, and the first sub-electrodes and the corresponding second sub-electrodes are electrically connected to each other through a via hole of the insulating layer 153. The second touch electrode 11T is arranged on the second metal layer 154, and the second touch electrode 11T is insulated from the second sub-electrode arranged on the same layer.

In addition, part of patterns of the first touch electrode 11R and the second touch electrode 11T may be formed on the first metal layer 152 synchronously, part of patterns of the first touch electrode 11R and the second touch electrode 11T may be formed on the second metal layer 154 synchronously, and then corresponding touch electrodes arranged on the two metal layers are connected to each other through the via hole of the insulating layer 153. Specific solutions for forming the first touch electrode 11R and the second touch electrode 11T are not limited in an embodiment of the present disclosure.

As shown in FIGS. 1 and 8, the detection pin 14 is arranged in the non-display region VA on a side of the display region AA in the second direction d2, the non-display region at which the detection pin 14 is arranged is the first region VA1, the non-display region on a side opposite the detection pin 14 is the second region VA2, and the non-display regions on two sides of the detection pin are the third region VA3 and the fourth region VA4.

Optionally, as shown in FIG. 1, one first touch electrode 11R may be correspondingly connected to one first touch electrode lead 12R, and one second touch electrode 11T may be correspondingly connected to one second touch electrode lead 12T.

The first touch electrode lead 12R is connected to one end of the corresponding first touch electrode 11R in the third region VA3 or the fourth region VA4 (FIG. 1 shows a case in which the first touch electrode lead 12R is arranged in the third region VA3), and the first touch electrode lead 12R extends to the first region VA1 along the third region VA3 or the fourth region VA4 (FIG. 1 shows a case in which the first touch electrode lead 12R extends in the third region VA3) by taking a location at which the corresponding first touch electrode 11R is connected as a starting point, and is connected to the corresponding first detection pin 14R. The second touch electrode lead 12T is connected to one end of the corresponding second touch electrode 11T in the first region VA1, the second touch electrode lead 12T extends along the first region VA1 by taking a location at which the corresponding second touch electrode 11T is connected as a starting point, and is connected to the corresponding second detection pin 14T.

The above first touch electrode 11R may be a touch sensing electrode, and the second touch electrode 11T may be a touch driving electrode. Under the condition that the display panel has a relatively small size, the touch driving electrode is only required to transmit a driving signal from a side to ensure relative balance of the signal at each location. In this way, the first touch electrode lead 12R connected to the first touch electrode 11R extends from the third region or the fourth region, and the second touch electrode lead 12T connected to the second touch electrode 11T extends from the first region, such that a connection distance between the second touch electrode lead 12T and the second detection pin 14T is relatively short, and a load of the second touch electrode lead 12T is prevented from being too large.

The lead label 13 corresponding to the first touch electrode lead 12R is arranged at a location adjacent to a starting point of the first touch electrode lead 12R. The lead label 13 corresponding to the second touch electrode lead 12T is arranged at a location adjacent to a starting point of the second touch electrode lead 12T. It can be seen from FIG. 1 that the first touch electrode lead 12R is connected to the corresponding first touch electrode 11R in the third region VA3, such that the lead label 13 corresponding to the first touch electrode lead 12R is arranged in the third region VA3. The second touch electrode lead 12T is connected to the corresponding second touch electrode 11T in the first region VA1, such that the lead label 13 corresponding to the second touch electrode lead 12T is arranged in the first region VA1.

Optionally, as shown in FIG. 8, one first touch electrode 11R may be correspondingly connected to one first touch electrode lead 12R, and one second touch electrode 11T may be correspondingly connected to two second touch electrode leads 12T; and the first touch electrode lead 12R is connected to one end of the corresponding first touch electrode 11R in the third region VA3, and the first touch electrode lead 12R extends to the first region VA1 along the third region VA3 by taking a location at which the corresponding first touch electrode 11R is connected as a starting point, and is connected to the corresponding first detection pin 14R. Part of the second touch electrode lead 12T is connected to one end of the corresponding second touch electrode 11T in the first region VA1, the second touch electrode lead 12T extends along the first region VA1 by taking a location at which the corresponding second touch electrode 11T is connected as a starting point, and is connected to the corresponding second detection pin 14T, the remaining part of the second touch electrode lead 12T is connected to one end of the corresponding second touch electrode 11T in the second region VA2, and the second touch electrode lead 12T extends to the first region VA1 along the fourth region VA4 by taking a location at which the corresponding second touch electrode 11T is connected as a starting point, and is connected to the corresponding second detection pin 14T.

The above first touch electrode 11R may be a touch sensing electrode, and the second touch electrode 11T may be a touch driving electrode. Under the condition that the display panel has a relatively large size, the touch driving electrode is only required to transmit a driving signal from two sides to ensure relative balance of a signal at each location. In this way, the first touch electrode lead 12R connected to the first touch electrode 11R extends from a side of the third region or the fourth region, the second touch electrode lead 12T connected to the second touch electrode 11T in the first region VA1 extends from the first region VA1, and the second touch electrode lead 12T connected to the second touch electrode 11T in the second region VA2 extends from the other side of the second region VA2 and the third region or the fourth region.

The lead label 13 corresponding to the first touch electrode lead 12R is arranged at a location adjacent to a starting point of the first touch electrode lead 12R. The lead label 13 corresponding to the second touch electrode lead 12T is arranged at a location adjacent to a starting point of the second touch electrode lead 12T. It can be seen from FIG. 1 that the first touch electrode lead 12R is connected to the corresponding first touch electrode 11R in the third region VA3, such that the lead label 13 corresponding to the first touch electrode lead 12R is arranged in the third region VA3. The lead label 13 corresponding to the second touch electrode lead 12T connected to the second touch electrode 11T in the first region is arranged in the first region VA1, and the lead label 13 corresponding to the second touch electrode lead 12T connected to the second touch electrode 11T in the second region is arranged in the second region VA2.

It should be noted that the touch electrode lead 12 is not directly connected to the detection pin 14 in general, but is connected to the detection pin 14 after passing through the first routing region f1, the bending region Bd, the second routing region f2 and the FPC pin region Fp as shown in FIG. 6 or 7. In this process, the touch electrode lead 12 may be connected to the detection pin 14 after being subjected to at least one layer switching, and for the specific implementation process, reference may be made to the above introduced content, which will not be repeated herein.

Figure 9:
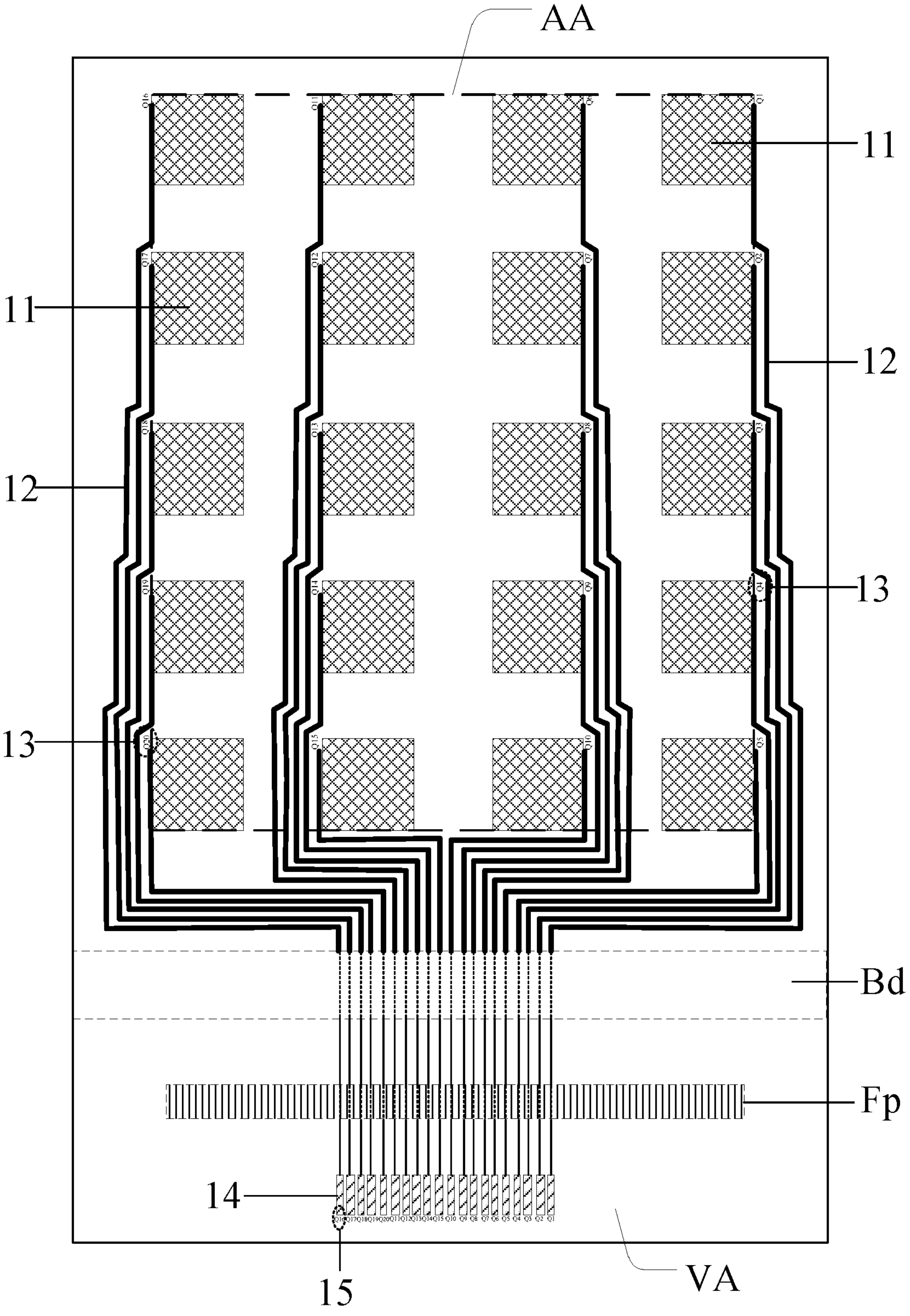
FIG. 9 is a third planar schematic structural diagram of a display panel according to embodiments of the present disclosure.

FIG. 9 is a third planar schematic structural diagram of a display panel according to an embodiment of the present disclosure.

Under the condition that a self-capacitance type display panel is used, with reference to FIG. 9, the touch electrode 11 includes a plurality of self-capacitance electrodes arranged in an array; and one end of the touch electrode lead 12 is connected to the corresponding self-capacitance electrode 11, and the other end of the touch electrode lead 12 is connected to the corresponding detection pin 14.

In a touch detection process, the self-capacitance electrode and the ground constitute a capacitor, and when a finger touches a display screen, capacitance of the finger will be superposed on capacitance of a screen, such that capacitance of the screen is increased, and a location at which touch of the display panel occurs may be determined by detecting a location at which capacitance changes.

Optionally, in the touch functional layer 120 of the self-capacitance type display panel, only one metal layer (the first metal layer 152 or the second metal layer 154) may be arranged in general, and the self-capacitance electrode 11 and the touch electrode lead 12 connected to the self-capacitance electrode 11 may be arranged on the same layer as the metal layer, thereby simplifying a structural design.

Optionally, the touch functional layer 120 may still be provided with two metal layers, and the self-capacitance electrode 11 includes a first self-capacitance electrode layer and a second self-capacitance electrode layer; and the first self-capacitance electrode layer is arranged on the same layer as the first metal layer 152, the second self-capacitance electrode layer is arranged on the same layer as the second metal layer 154, and the first self-capacitance electrode layer and the second self-capacitance electrode layer are electrically connected to each other through the via hole of the insulating layer 153. A two-layer arrangement method of the touch electrodes may effectively reduce a load, thereby stabilizing a driving signal.

As shown in FIG. 9, the touch electrode lead 12 extends to a location at which the detection pin 14 is arranged by taking a location connected to the corresponding self-capacitance electrode 11 as a starting point, and is connected to the corresponding detection pin 14. Each self-capacitance electrode 11 is required and connected to the detection pin 14 by means of a touch electrode lead 12, and each touch electrode lead 12 may extend to a location of the detection pin 14 in a shortest path according to a location of the self-capacitance electrode 11.

The lead label 13 corresponding to the touch electrode lead 12 is arranged at a location adjacent to the starting point of the touch electrode lead. It can be seen from FIG. 7 that the lead label 13 corresponding to the touch electrode lead 12 may be arranged at a location adjacent to the touch electrode lead 12 connected to the self-capacitance electrode 11.

It should be noted that the touch electrode lead 12 is not directly connected to the detection pin 14 in general, but is connected to the detection pin 14 after passing through the first routing region f1, the bending region Bd, the second routing region f2 and the FPC pin region Fp as shown in FIG. 6 or 7. In this process, the touch electrode lead 12 may be connected to the detection pin 14 after being subjected to at least one layer switching, and for the specific implementation process, reference may be made to the above introduced content, which will not be repeated herein.

Figure 10:
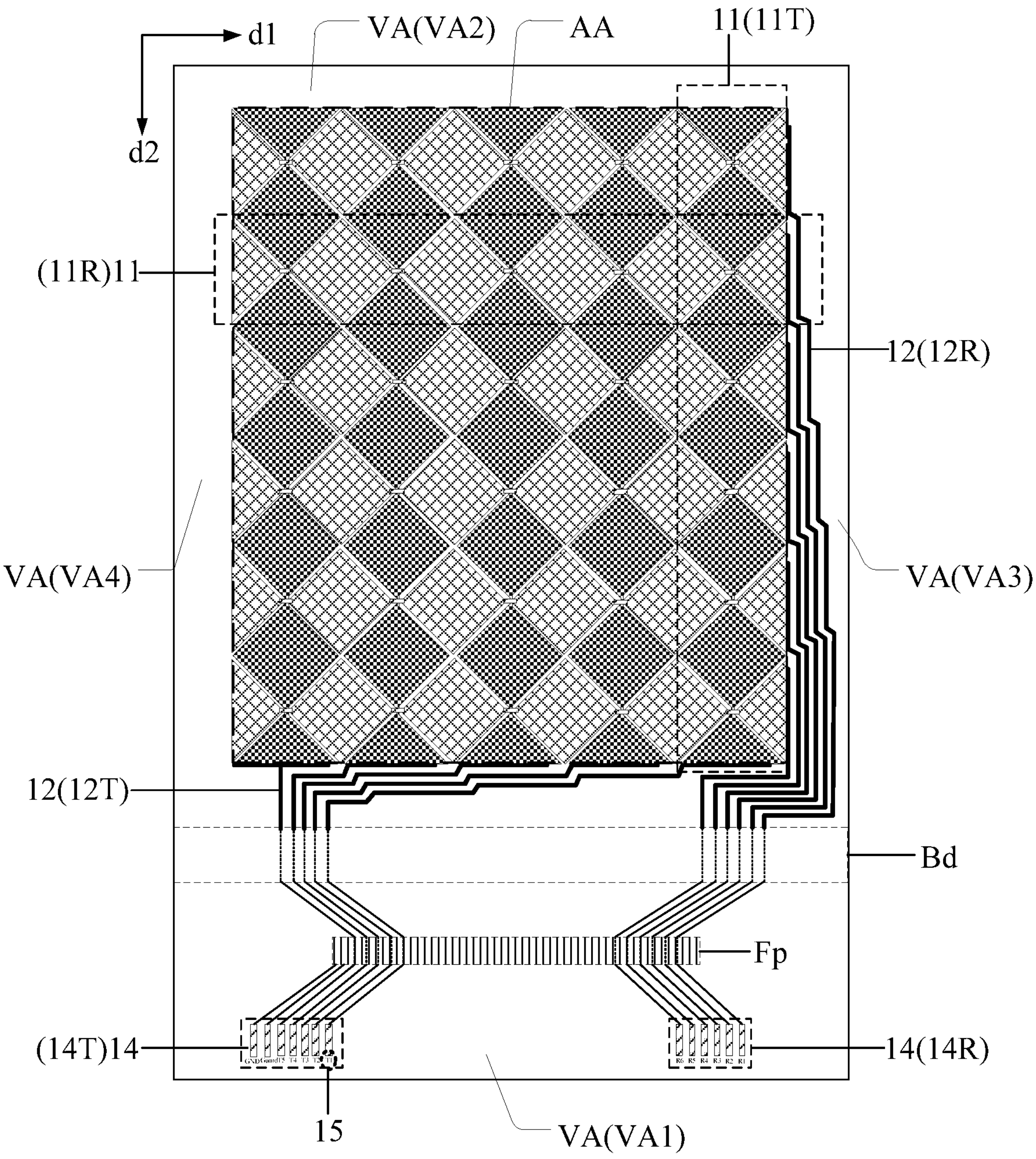
FIG. 10 is a fourth planar schematic structural diagram of a display panel according to embodiments of the present disclosure.

An embodiment of the present disclosure further provides a display panel. FIG. 10 is a fourth planar schematic structural diagram of a display panel according to an embodiment of the present disclosure.

With reference to FIG. 10, a display panel includes: a display region AA and a non-display region VA surrounding the display region AA. The display region AA is used for image display, and the non-display region VA may be used for wiring and binding.

The display region AA includes a plurality of touch electrodes 11. In an embodiment of the present disclosure, the touch electrode 11 is formed by a metal mesh, and when a finger touches the display region AA, a capacitance value of the touch electrode changes, so as to detect a touch location.

The display panel includes a plurality of touch electrode leads 12, and each touch electrode 11 is connected to at least one touch electrode lead 12. The touch electrodes 11 are connected to a driving chip in the non-display region VA by being connected to the touch electrode leads 12, and the driving chip applies driving signals to the corresponding touch electrodes 11 by means of the touch electrode leads 12, touch signals generated by the touch electrodes 11 may be also transmitted to the driving chip by means of the touch electrode leads 12 such that the driving chip may detect a location at which touch occurs.

The display panel further includes a detection pin 14 and a pin label 15.

The detection pins 14 are arranged in the non-display region VA on a side of the display region AA; and the touch electrode leads 12 extend along edges of the display region AA to the non-display region at which the detection pins 14 are arranged, and are finally connected to the corresponding detection pins 14.

The detection pins 14 are used for providing driving signals for the touch electrodes 11 in a detection stage, so as to detect whether each touch channel is abnormal. After detection is completed, the driving chip is bound again, the touch electrode leads 12 are electrically connected to the driving chip, and the driving chip receives touch signals or sends the driving signals.

In a specific application process, the touch electrode leads 12 may be directly connected to the detection pins 14, or may be finally connected to the detection pins 14 after being subjected to layer switching in the non-display region, which is not limited herein.

Pin labels 15 for identifying the detection pins 14 are further arranged around the detection pins 14.

Paths are formed between the detection pins 14, the touch electrode leads 12 and the touch electrodes 11, and after the pin labels 15 are added to the detection pins 14, it is more convenient to analyze touch performance of the panel, and under the condition that touch performance of the panel is poor, locations of the touch channels having problems may be quickly and accurately found.

Optionally, the pin label 15 may be arranged at a location adjacent to a side of the detection pin 14 facing away from the connected touch electrode lead 12. In this way, the detection pins 14 may be identified more intuitively.

Thus, by adding pin labels 15 to detection pins 14, confusion when drawings are designed for the touch electrodes and the touch electrode leads is avoided, and after the drawings are designed, channels constituted by the touch electrode leads and the connected touch electrodes may be precisely calibrated according to the lead labels, so as to improve efficiency of drawing inspection. Moreover, under the condition that touch performance of the panel is poor, a location of the touch channel at which a problem occurs may be quickly and accurately found, and analyzed.

Similarly, the display panel may be of a structure shown in FIG. 4 or 5, the touch electrode 11 is arranged in the metal layer of the touch functional layer 150; the touch electrode lead 12 is arranged on the same layer as at least one metal layer of the touch functional layer 150; the detection pin 14 is arranged on the same layer as at least one metal layer of the driving circuit layer 120 and/or at least one metal layer of the touch functional layer 150; and the pin label 15 is arranged on the same layer as at least one metal layer of the driving circuit layer 120 and/or at least one metal layer of the touch functional layer 150.

Specifically, under the condition that the above display panel is a mutual capacitance type display panel, the touch functional layer 150 includes a first metal layer 152 and a second metal layer 154, and the touch electrode 11 is arranged on the same layer as the first metal layer 152 and the second metal layer 154. Under the condition that the above display panel is a self-capacitance type display panel, the touch functional layer 150 is only required to include one metal layer, that is, the above first metal layer 152 or the second metal layer 154, and the touch electrode is arranged on the same layer as the metal layer.

The touch electrode lead 12 is arranged on the same layer as at least one metal layer of the touch functional layer 150. Alternatively, in order to reduce a load of the touch electrode leads 12, under the condition that the touch functional layer

150 includes a first metal layer 152 and a second metal layer 154, patterns of the touch electrode leads 12 may be formed on both the first metal layer 152 and the second metal layer 154, and then two layers of touch electrode leads are electrically connected to each other through the via hole in the insulating layer between the two metal layers.

The detection pin 14 may be arranged on the same layer as at least one metal layer of the driving circuit layer 120 and/or at least one metal layer of the touch functional layer 150. The detection pin 14 may be of a single-layer structure or a multi-layer structure.

Under the condition that the display panel is of a structure shown in FIG. 4 and the detection pin 14 is of a single-layer structure, the detection pin 14 may be arranged on the same layer as the source and drain metal layer 126 in FIG. 4; and alternatively, the detection pin 14 may be arranged on the same layer as the second metal layer 154. Under the condition that the display panel is of a structure shown in FIG. 4 and the detection pin 14 is of a multi-layer structure, the detection pin 14 may be arranged on the same layer as the source and drain metal layer 126 and the second metal layer 154 in FIG. 4.

Under the condition that the display panel is of a structure shown in FIG. 5 and the detection pin 14 is of a single-layer structure, the detection pin 14 may be arranged on the same layer as the second source and drain metal layer 128 in FIG. 5; and alternatively, the detection pin 14 may be arranged on the same layer as the second metal layer 154. Under the condition that the display panel is of a structure shown in FIG. 5 and the detection pin 14 is of a multi-layer structure, the detection pin 14 may be arranged on the same layer as the second source and drain metal layer 128 and the second metal layer 154 in FIG. 5.

The pin label 15 may be arranged on the same layer as at least one metal layer of the driving circuit layer 120 and/or at least one metal layer of the touch functional layer 150.

Optionally, in order to enable the pin label 15 to be arranged on an uppermost metal layer, for example, the pin label 15 may be arranged on the same layer as the second metal layer 154. In addition, the pin label 15 may be arranged on the same layer as the detection pin 14, which is not specifically limited herein.

For a connection relation between the touch electrode lead 12 and the detection pin 14, reference may be made to the above embodiments, which will not be repeated herein.

On the basis of the same inventive concept, an embodiment of the present disclosure further provides a display apparatus including any one of the display panels. Since the principle of solving problems of the display apparatus is similar to that of the above display panel, for implementation of the display apparatus, reference may be made to implementation of the above display panel, and repetitions will not be described.

Although the preferred embodiments of the present disclosure have been described, a person skilled in the art can make additional changes and modifications to these embodiments once they learn the basic inventive concept. Therefore, the appended claims are intended to be interpreted as including the preferred embodiments and all changes and modifications falling within the scope of the present disclosure.

Apparently, a person skilled in the art can make various modifications and variations to embodiments of the present disclosure without departing from the spirit and scope of the embodiments of the present disclosure. In this way, if these modifications and variations of embodiments of the present disclosure fall within the scope of the claims of the present disclosure and equivalent technologies thereof, the present disclosure is also intended to include these modifications and variations.

What is claimed is:

1. A display panel, comprising:

a plurality of touch electrodes; and a plurality of touch electrode leads, at least one touch electrode being connected to at least one touch electrode lead; wherein the display panel comprises a display region and a non-display region surrounding the display region, the plurality of touch electrodes being arranged in the display region; and the display panel further comprises a lead label arranged around the at least one touch electrode lead and used for identifying the touch electrode lead;

wherein the display panel further comprises a base substrate;

a driving circuit layer arranged on the base substrate and comprising a plurality of metal layers;

an organic light-emitting diode device layer arranged on a side of the driving circuit layer facing away from the base substrate;

an encapsulation layer arranged on a side of the organic light-emitting diode device layer facing away from the base substrate; and a touch functional layer arranged on a side of the encapsulation layer facing away from the organic light-emitting diode device layer and comprising at least one metal layer;

wherein the lead labels are arranged through a patterning process on the same layer as the at least one metal layer of the touch functional layer.

2. The display panel according to claim 1, wherein the lead label is arranged adjacent to a location where the at least one touch electrode lead is connected to a corresponding touch electrode.

3. The display panel according to claim 1, further comprising:

detection pins arranged in the non-display region on a side of the display region, the touch electrode leads extending along edges of the display region and connected to corresponding detection pins; and pin labels arranged around the detection pins and used for identifying corresponding detection pins;

wherein the pin labels are arranged through the patterning process on the same layer as at least one metal layer of the driving circuit layer and/or the at least one metal layer of the touch functional layer.

4. The display panel according to claim 3, wherein the pin label is arranged at a location adjacent to a side of the detection pin facing away from the touch electrode lead connected to the detection pin;

wherein identification content of the corresponding lead label connected to the touch electrode lead is the same as identification content of the pin label corresponding to the detection pin connected to the touch electrode lead;

wherein the identification content of the lead label is letters, numbers or combinations of letters and numbers; and the identification content of the pin label is letters, numbers or combinations of letters and numbers.

5. The display panel according to claim 1, comprising:

the touch electrodes are arranged in the metal layer of the touch functional layer;

the touch electrode leads are arranged on the same layer as the at least one metal layer of the touch functional layer;

the detection pins are arranged on the same layer as at least one metal layer of the driving circuit layer and/or the at least one metal layer of the touch functional layer.

6. The display panel according to claim 5, wherein the touch functional layer comprises:

a touch barrier layer arranged on a surface of the side of the encapsulation layer facing away from the organic light-emitting diode device layer;

a first metal layer arranged on a surface of a side of the touch barrier layer facing away from the encapsulation layer;

an insulating layer arranged on a surface of a side of the first metal layer facing away from the touch barrier layer;

a second metal layer arranged on a surface of a side of the insulating layer facing away from the first metal layer; and a protective layer arranged on a surface of a side of the second metal layer facing away from the insulating layer; and the touch electrode lead comprises:

a first lead layer arranged on the same layer as the first metal layer;

a second lead layer arranged on the same layer as the second metal layer;

the first lead layer is electrically connected to the second lead layer through a via hole of the insulating layer; and the lead labels are arranged on the same layer as the first metal layer or the second metal layer.

7. The display panel according to claim 6, wherein the driving circuit layer comprises:

a buffer layer arranged on the base substrate;

an active layer arranged on a side of the buffer layer facing away from the base substrate;

a gate insulating layer arranged on a side of the active layer facing away from the buffer layer;

a gate metal layer arranged on a side of the gate insulating layer facing away from the active layer;

an interlayer insulating layer arranged on a side of the gate metal layer facing away from the gate insulating layer;

a first source and drain metal layer arranged on a side of the interlayer insulating layer facing away from the gate metal layer;

a first planarization layer arranged on a side of the first source and drain metal layer facing away from the interlayer insulating layer;

a second source and drain metal layer arranged on a side of the first planarization layer facing away from the first source and drain metal layer; and a second planarization layer arranged on a side of the second source and drain metal layer facing away from the first planarization layer; wherein the detection pins are arranged on the same layer as the second source and drain metal layer and/or the detection pins are arranged on the same layer as the second metal layer, and the pin labels are arranged on the same layer as the second source and drain metal layer and/or the pin labels are arranged on the same layer as the second metal layer.

8. The display panel according to claim 1, wherein the plurality of touch electrodes comprise a plurality of first touch electrodes and a plurality of second touch electrodes; the first touch electrodes extend in a first direction and are arranged in a second direction; the second touch electrodes extend in the second direction and are arranged in the first direction; the first direction and the second direction intersect; the first touch electrodes are insulated from the second touch electrodes;

the plurality of touch electrode leads comprise a plurality of first touch electrode leads and a plurality of second touch electrode leads; the detection pins comprise a plurality of first detection pins and a plurality of second detection pins; one ends of the first touch electrode leads are connected to the corresponding first touch electrodes, and the other ends of the first touch electrode leads are connected to the corresponding first detection pins; and one ends of the second touch electrode leads are connected to the corresponding second touch electrodes, and the other ends of the second touch electrode leads are connected to the corresponding second detection pins.

9. The display panel according to claim 8, wherein the first touch electrodes are arranged in the first metal layer, and the second touch electrodes are arranged in the second metal layer; or the first touch electrodes comprise first sub-electrodes and second sub-electrodes, the first sub-electrodes are arranged in the first metal layer, the second sub-electrodes are arranged in the second metal layer, and the first sub-electrodes are electrically connected to the corresponding second sub-electrodes through a via hole of an insulating layer; and the second touch electrodes are arranged in the second metal layer.

10. The display panel according to claim 8, wherein the detection pins are arranged in the non-display region on a side of the display region in the second direction, the non-display region at which the detection pins are arranged is a first region, the non-display region on a side opposite the detection pins is a second region, and the non-display regions on two sides of the detection pins are a third region and a fourth region;

one first touch electrode is correspondingly connected to one first touch electrode lead, and one second touch electrode is correspondingly connected to one second touch electrode lead; the first touch electrode lead is connected to one end of the corresponding first touch electrode in the third region or the fourth region, the first touch electrode lead extends to the first region along the third region or the fourth region by taking a location at which the corresponding first touch electrode is connected as a starting point, and is connected to the corresponding first detection pin; and the second touch electrode lead is connected to one end of the corresponding second touch electrode in the first region, and the second touch electrode lead extends along the first region by taking a location at which the corresponding second touch electrode is connected as a starting point, and is connected to the corresponding second detection pin;

wherein the lead label corresponding to the first touch electrode lead is arranged at a location adjacent to a starting point of the first touch electrode lead; and the lead label corresponding to the second touch electrode lead is arranged at a location adjacent to a starting point of the second touch electrode lead.

11. A display panel, comprising:

a plurality of touch electrodes;

a plurality of touch electrode leads, at least one touch electrode being connected to at least one touch electrode lead; and a plurality of detection pins, one touch electrode lead being connected to one detection pin; wherein the display panel comprises a display region and a non-display region surrounding the display region, and the plurality of touch electrodes are arranged in the display region; the touch electrode leads extend along edges of the display region and are connected to the corresponding detection pins; and the display panel further comprises a pin label arranged around at least one detection pin and used for identifying the detection pin;

wherein the display panel further comprises:

a base substrate;

a driving circuit layer arranged on the base substrate and comprising a plurality of metal layers;

an organic light-emitting diode device layer arranged on a side of the driving circuit layer facing away from the base substrate;

an encapsulation layer arranged on a side of the organic light-emitting diode device layer facing away from the base substrate; and a touch functional layer arranged on a side of the encapsulation layer facing away from the organic light-emitting diode device layer and comprising at least one metal layer;

wherein the pin labels are arranged through a patterning process on the same layer as at least one metal layer of the driving circuit layer and/or the at least one metal layer of the touch functional layer.

12. The display panel according to claim 11, wherein the pin label is arranged at a location adjacent to a side of the detection pin facing away from the touch electrode lead connected to the detection pin.

13. The display panel according to claim 11, wherein the touch electrodes are arranged in the metal layer of the touch functional layer;

the touch electrode leads are arranged on the same layer as the at least one metal layer of the touch functional layer;

the detection pins are arranged on the same layer as at least one metal layer of the driving circuit layer and/or the at least one metal layer of the touch functional layer.

14. The display panel according to claim 13, wherein the driving circuit layer comprises:

a buffer layer arranged on the base substrate;

an active layer arranged on a side of the buffer layer facing away from the base substrate;

a gate insulating layer arranged on a side of the active layer facing away from the buffer layer;

a gate metal layer arranged on a side of the gate insulating layer facing away from the active layer;

an interlayer insulating layer arranged on a side of the gate metal layer facing away from the gate insulating layer;

a first source and drain metal layer arranged on a side of the interlayer insulating layer facing away from the gate metal layer;

a first planarization layer arranged on a side of the first source and drain metal layer facing away from the interlayer insulating layer;

a second source and drain metal layer arranged on a side of the first planarization layer facing away from the first source and drain metal layer; and a second planarization layer arranged on a side of the second source and drain metal layer facing away from the first planarization layer; wherein the detection pins are arranged on the same layer as the second source and drain metal layer and/or the detection pins are arranged on the same layer as the second metal layer, and the pin labels are arranged on the same layer as the second source and drain metal layer and/or the pin labels are arranged on the same layer as the second metal layer.

15. A display apparatus, comprising a display panel, wherein the display panel comprises:

a plurality of touch electrodes; and a plurality of touch electrode leads, at least one touch electrode being connected to at least one touch electrode lead; wherein the display panel comprises a display region and a non-display region surrounding the display region, the plurality of touch electrodes being arranged in the display region; and the display panel further comprises a lead label arranged around the at least one touch electrode lead and used for identifying the touch electrode lead;

wherein the display panel further comprises a base substrate;

a driving circuit layer arranged on the base substrate and comprising a plurality of metal layers;

an organic light-emitting diode device layer arranged on a side of the driving circuit layer facing away from the base substrate;

an encapsulation layer arranged on a side of the organic light-emitting diode device layer facing away from the base substrate; and a touch functional layer arranged on a side of the encapsulation layer facing away from the organic light-emitting diode device layer and comprising at least one metal layer;

wherein the lead labels are arranged through a patterning process on the same layer as the at least one metal layer of the touch functional layer.

16. A display apparatus, comprising the display panel of claim 11.

* * * * *